United States Patent
Kawamura

(10) Patent No.: US 7,129,873 B2
(45) Date of Patent: *Oct. 31, 2006

(54) VARIABLE-ORDER DELTA SIGMA MODULATOR AND DA CONVERTER

(75) Inventor: Akinobu Kawamura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/994,306

(22) Filed: Nov. 23, 2004

(65) Prior Publication Data

US 2005/0088328 A1    Apr. 28, 2005

Related U.S. Application Data

(62) Division of application No. 10/635,638, filed on Aug. 7, 2003, now Pat. No. 6,839,012.

(30) Foreign Application Priority Data

Aug. 12, 2002  (JP)  ............................ 2002-234925

(51) Int. Cl.
   *H03M 3/00*   (2006.01)
(52) U.S. Cl. ....................................... 341/143; 341/155
(58) Field of Classification Search ................ 341/143, 341/155
   See application file for complete search history.

(56) References Cited

U.S. PATENT DOCUMENTS 5,274,375 A  *  12/1993  Thompson .................. 341/143
6,556,159 B1    4/2003  Fei et al.

FOREIGN PATENT DOCUMENTS

| | | |
|---|---|---|
| JP | 11-355142 A | 12/1999 |
| WO | WO 01/10035 A1 | 2/2001 |

* cited by examiner

*Primary Examiner*—Jean Bruner Jeanglaude
(74) *Attorney, Agent, or Firm*—Sughrue Mion, PLLC

(57) ABSTRACT

The variable-order delta sigma modulator of the invention is capable of setting an optimum order in relation to a sampling frequency to be used, when using one out of plural sampling frequencies. As to the delta sigma modulator of the third order or higher, in a combination of two arbitrary continued integrators constituting the modulator is furnished a means that connects or disconnects the circuit on the second integrator side at the part of connecting the first integrator and the second integrator, or a means of switching the relation of connections. Connecting or disconnecting the circuit through the means and switching the relation of connections will set the order of the delta sigma modulator into an optimum order in relation to a sampling frequency.

5 Claims, 5 Drawing Sheets

FIG. 3
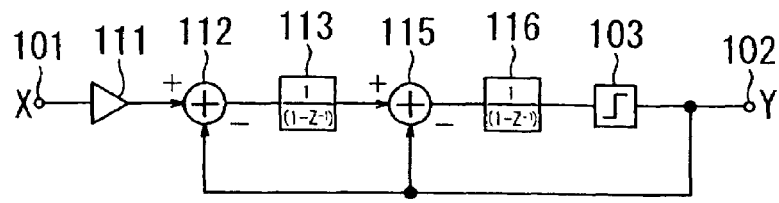
FIG. 4
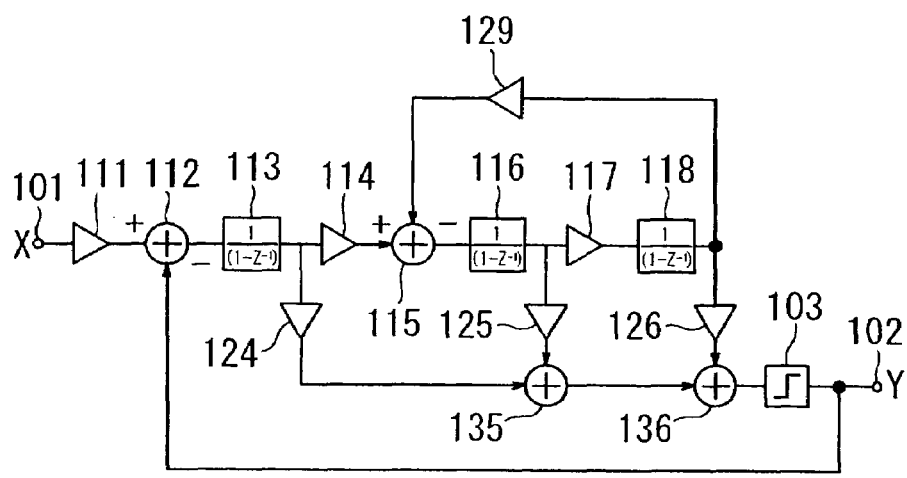
FIG. 5
|  | S1 | S2 | S3 | S4 | S5 | S6 | S7 |
|---|---|---|---|---|---|---|---|
| 5th order | N | N | N | N | N | N | N |
| 4th order | N | N | N | N | N | N | F |
| 3rd order | N | N | N | N | N | F | F |
| 2nd order | F | F | F | F | F | F | F |

FIG. 6
| sampling frequency | optimum order |
|---|---|
| 8KHz | second |
| 16KHz | fourth |
| 32KHz | fifth |
| 44.1KHz | fourth (or fifth) |
| 48KHz | fifth |
FIG. 7
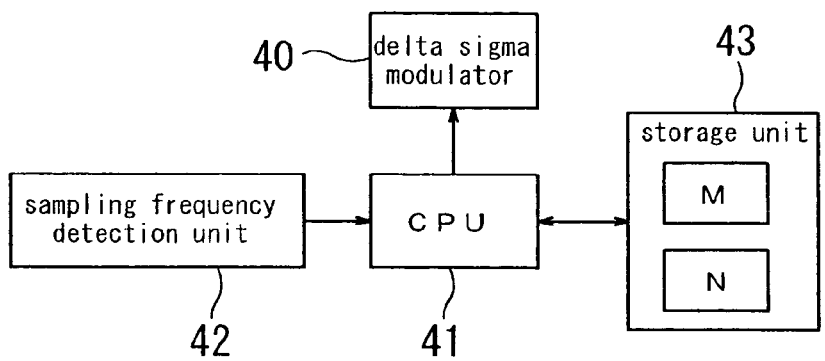
FIG. 8
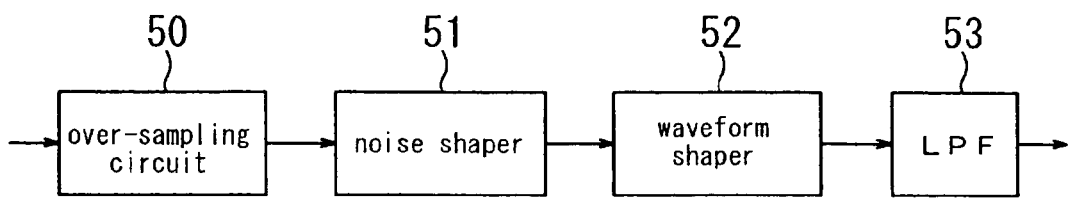

VARIABLE-ORDER DELTA SIGMA MODULATOR AND DA CONVERTER

This is a divisional of application Ser. No. 10/635,638 filed Aug. 7, 2003 now U.S. Pat. No. 6,839,012. The entire disclosure(s) of the prior application(s), application number(s) 10/635,638 is considered part of the disclosure of the accompanying application and is hereby incorporated by reference.

BACKGROUND OF THE INVENTION

1. Field of the Invention

The present invention relates to a delta sigma modulator, specifically to a delta sigma modulator capable of switching an order thereof into an optimum order in relation to a sampling frequency.

2. Description of the Related Art

At present, many cellular phones, PDAs (Personal Digital Assistance), portable music reproducers, and so forth use a DA converter. As this sort of DA converter is widely known the DA converter that incorporates a delta sigma modulator. This DA converter furnished with the delta sigma modulator executes a quantization with fewer bits such as one-bit quantization by means of the over-sampling circuit and noise shaper, and thereby reduces aliasing and quantization noises, and noises in the low frequency band.

Now, in the delta sigma modulator used in the noise shaper, there exists a unique relation between the SN ratio and the order of the delta sigma modulator in correspondence with each of the sampling frequencies as an example, as illustrated in FIG. 9. In the drawing, X-axis represents the order of the delta sigma modulator, and Y-axis represents the SN ratio.

According to this graph, when the sampling frequency is 8 kHz, and when the order of the delta sigma modulator is the third order, the SN ratio becomes the maximum at about 57 dB; when the order increases to the fourth or fifth order, the SN ratio decreases to 55 dB or 40 dB.

In contrast this, when the sampling frequency is 16 kHz, and when the order of the delta sigma modulator is the second order, the SN ratio is about 62 dB; when the order becomes the third or fourth, the SN ratio increases to 72 dB or 73 dB; and when the order is the fifth, the SN ratio decreases to about 69 dB.

Further, when the sampling frequency is 32 kHz, and when the order of the delta sigma modulator is the second order, the SN ratio is 80 dB; when the order is the third, the SN ratio increases; and when the order is the fourth or fifth, the SN ratio reaches the peak at about 90 dB.

As it is clear from the above, the SN ratio will increase or decrease depending on the sampling frequency when the order increases. The delta sigma modulator with a higher order does not necessarily produce a higher SN ratio. Here, FIG. 9 only gives one example, and such a disposition as shown in FIG. 9 does not always appear.

Conventionally, the delta sigma modulator used in the DA converter is designed on the assumption of a specific sampling frequency; accordingly, the order of the delta sigma modulator is fixed, and it could not be changed freely. However in recent years, the mobile telephones can be used in the voice mode on speech communications, or they can be used in the audio mode that outputs a piece of music downloaded; there increases a possibility of using the DA converter with different sampling frequencies.

When the DA converter is used in the audio band (20 kHz), to maximize the SN ratio in connection with the sampling frequency (44.1 kHz) is to select the delta sigma modulator of the fourth or fifth order as the optimum order. However, using this delta sigma modulator with the lower sampling frequency (8 kHz) that handles the voice will deteriorate the SN ratio, in comparison to the delta sigma modulator of the second or third order.

In reverse, when the modulator is used with the lower sampling frequency (8 kHz), the delta sigma modulator of the third order is to be selected in view of the optimum SN ratio; and, when the delta sigma modulator of the third order is used with the higher sampling frequency (44.1 kHz) for the audio band, the SN ratio will deteriorate in comparison to the delta sigma modulator of the fourth or fifth order.

In this manner, there is a specific relation between the sampling frequency and the optimum order of the delta sigma modulator. For example, it is clear that when the sampling frequency is 8 kHz, 16 kHz, 32 kHz, 44.1 kHz, or 48 kHz, the optimum order is the second, fourth, fifth, fourth (or fifth), or fifth, respectively. This is shown in FIG. 6.

In order to always set an optimum order in correspondence with variations of the sampling frequencies, it is conceivable to prepare the delta sigma modulators of the first order to the n-th order in advance, and to make them selectable by switching. However, such a design will enlarge the circuit scale only to raise the cost and increase waste. As to the switching operation of the order, it is extremely annoying to manually switch the order of the modulator at each time, accompanied with the switching of the sampling frequencies, which will create malfunctions.

SUMMARY OF THE INVENTION

The invention has been made in view of the above problems, and an object of the invention is to make it possible to always set an optimum order in relation to a sampling frequency to be used, when using one out of plural sampling frequencies by switching in a variable-order delta sigma modulator, and to achieve the variable-order delta sigma modulator with as much simplified a circuit configuration as possible.

Another object of the invention is to achieve the delta sigma modulator capable of detecting a new sampling frequency when the sampling frequency is varied, which is capable of automatically switching the order into an optimum one to a new sampling frequency detected.

And, another object of the invention is to realize a DA converter that exhibits the maximum SN ratio in relation to a sampling frequency to be used, by applying the variable-order delta sigma modulator to a noise shaper.

According to one aspect of the invention, the variable-order delta sigma modulator contains means that vary a combination of plural integrators constituting a delta sigma modulator to thereby vary an order of the delta sigma modulator. And, the above means vary the order of the modulator into an optimum order in relation to a sampling frequency.

According to another aspect of the invention, the variable-order delta sigma modulator is configured to supply quantization errors to next-stage integrators. And, the modulator includes means of disconnecting or connecting circuits, provided in connection parts to supply the quantization errors to the next stage integrators, and means of controlling the disconnecting or connecting means. Thereby, the order of the modulator is made variable.

In the above invention, the variable-order delta sigma modulator may include a control means that switches the order of the modulator into an order optimum to a new sampling frequency, accompanied with the switching of the sampling frequency, on the basis of a table showing connections or disconnections of the integrators by the means that vary the order of the delta sigma modulator and the combination of plural integrators, and a table showing relations between the sampling frequencies and the optimum orders.

According to another aspect of the invention, the DA converter is provided with any one of the delta sigma modulator mentioned above.

According to the invention, it is possible to implement an optimum-order delta sigma modulator to each sampling frequency to be used, in a device capable of switching the sampling frequencies. In consequence, the modulator is able to always maintain the maximum SN ratio.

And, since the order of the delta sigma modulator is switched automatically accompanied with the switching of the sampling frequencies, it is not necessary for the user to manually switch the order of the delta sigma modulator, and the user is able to attain the best performance.

Further, the invention realizes a DA converter having the maximum SN ratio in relation to the sampling frequency to be used.

BRIEF DESCRIPTION OF THE DRAWINGS

FIG. 3 is an equivalent block diagram of the variable-order delta sigma modulator relating to the second embodiment, when all the selectors are switched into the F-terminals in the modulator;

FIG. 4 is an equivalent block diagram of the variable-order delta sigma modulator relating to the second embodiment, when the selectors S1 through S5 are switched into the N-terminals, and the selectors S6 and S7 are switched into the F-terminals in the modulator;

FIG. 5 is a table that describes the relation between the connection state of the selector and the order, in the variable-order delta sigma modulator relating to the second embodiment;

FIG. 6 is a table that describes the relation between the sampling frequency and the optimum order;

FIG. 7 illustrates a delta sigma modulator having a means of automatically switching the order;

FIG. 8 is a block diagram of a DA converter; and

DETAILED DESCRIPTION OF THE PREFERRED EMBODIMENTS

Figure 1:
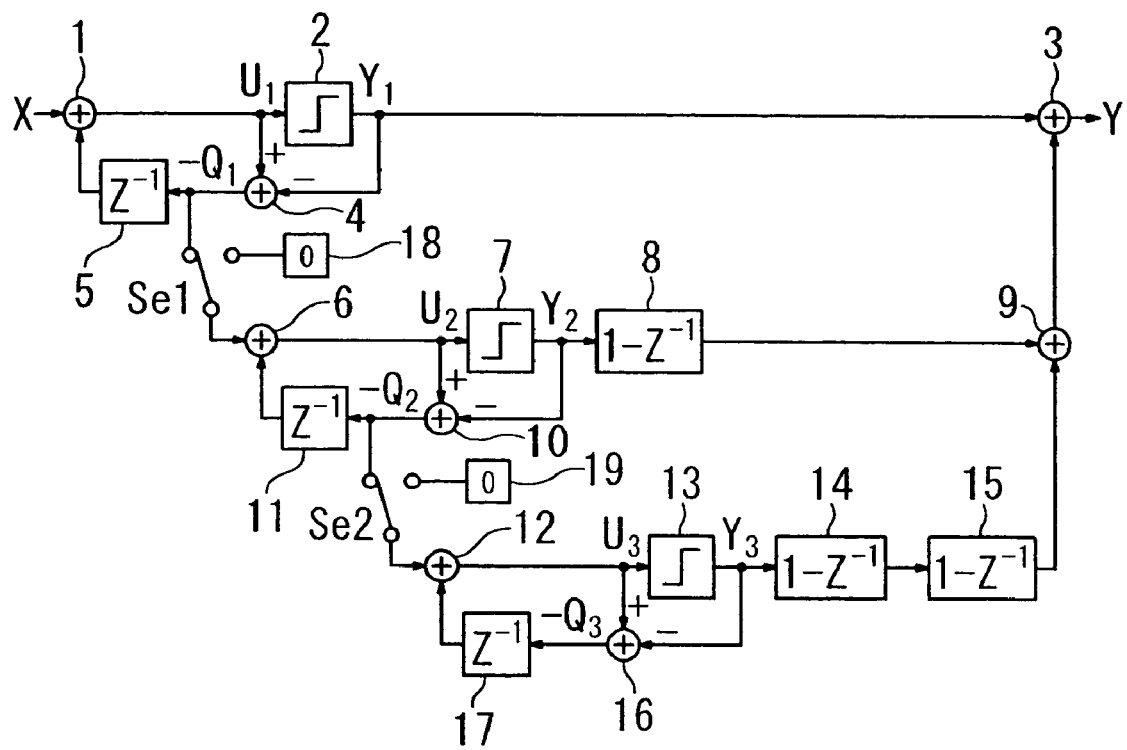
FIG. 1 is a block diagram of a variable-order delta sigma modulator relating to the first embodiment of the invention.

FIG. 1 illustrates a block diagram of the variable-order delta sigma modulator relating to the first embodiment. In the drawing, an adder 1 adds a digital input signal X and a delay signal of a quantization error −Q1 described later. A quantizer 2 receives an output U1 from the adder 1 to output a quantized signal Y1. An adder 3 adds the quantized signal Y1 and an output from an adder 9 described later to output a delta sigma modulator output Y. A subtracter 4 subtracts the quantized signal Y1 from the output U1 of the adder 1 to output a first quantization error −Q1. A delay circuit 5 is inserted between the subtracter 4 and the adder 1, and it generates a delay signal of the first quantization error −Q1.

An adder 6 adds the first quantization error −Q1 being the output of the subtracter 4 and a signal obtained by delaying an output from a subtracter 10 described later to output an added output U2. A selector Se1 is provided between the adder 6 and the subtracter 4, which selects the output from the subtracter 4 or the output from a terminal 18 that supplies the zero signal. A quantizer 7 quantizes the added output U2 to output a quantized signal Y2. A differential signal generator 8 generates a differential signal between the quantized signal Y2 and a delay output thereof. An adder 9 adds this differential signal and a signal from a differential signal generator 15 described later. A subtracter 10 subtracts the output Y2 of the quantizer 7 from the output U2 of the adder 6 to output a second quantization error −Q2. A delay circuit 11 is provided between the subtracter 10 and the adder 6, and it generates a delay signal of the second quantization error −Q2.

An adder 12 adds the second quantization error −Q2 being the output of the subtracter 10 and a signal obtained by delaying an output from a subtracter 16 described later to output an added output U3. A selector Se2 is provided between the adder 12 and the subtracter 10, which selects the output from the subtracter or the output from a terminal 19 that supplies the zero signal. A quantizer 13 quantizes the added output U3 to output a quantized signal Y3. A differential signal generator 14 generates a differential signal between the quantized signal Y3 and a delay output thereof. A differential signal generator generates a differential signal between the signal from the differential signal generator 14 and a delay output thereof. A subtracter 16 subtracts the output Y3 of the quantizer 13 from the output U3 of the adder 12 to output a third quantization error −Q3. A delay circuit 17 is provided between the subtracter 16 and the adder 12, and it generates a delay signal of the third quantization error −Q3.

The relation of the selector and the order will be described in regard to this circuit. To connect the selector Se1 to the output of the subtracter 4, and to connect the selector Se2 to the output of the subtracter 10 will make up a modulator composed of three integrators, namely, a third order delta sigma modulator. To connect the selector Se1 to the output of the subtracter 4, and to connect the selector Se2 to the terminal 19 that supplies the zero signal will disconnect the circuit blocks from the adder 12 through the delay circuit 17, which constitutes a second order delta sigma modulator. Further, to connect the selector Se1 and the selector Se2 to the terminals 18 and 19 supplying the zero signal will also disconnect the circuit blocks from the adder 6 through the delay circuit 11, which constitutes a first order delta sigma modulator.

Thus, in the delta sigma modulator that supplies the quantization error to the integrator in the following stage, it is possible to make up a variable-order delta sigma modulator by using a selector for the connection circuit that transmits the quantization error to the following stage.

This embodiment relates the third order delta sigma modulator that supplies the quantization error to the integrator in the following stage. In the same manner, it is possible to configure a delta sigma modulator of the fourth order or higher, by supplying the quantization error to the integrator in the following stage; and it is clear that also in the delta sigma modulator of the fourth order or higher, the order can be made variable by providing the selector to disconnect or connect the circuit in the connection part that supplies the quantization error to the next stage integrator.

Figure 2:
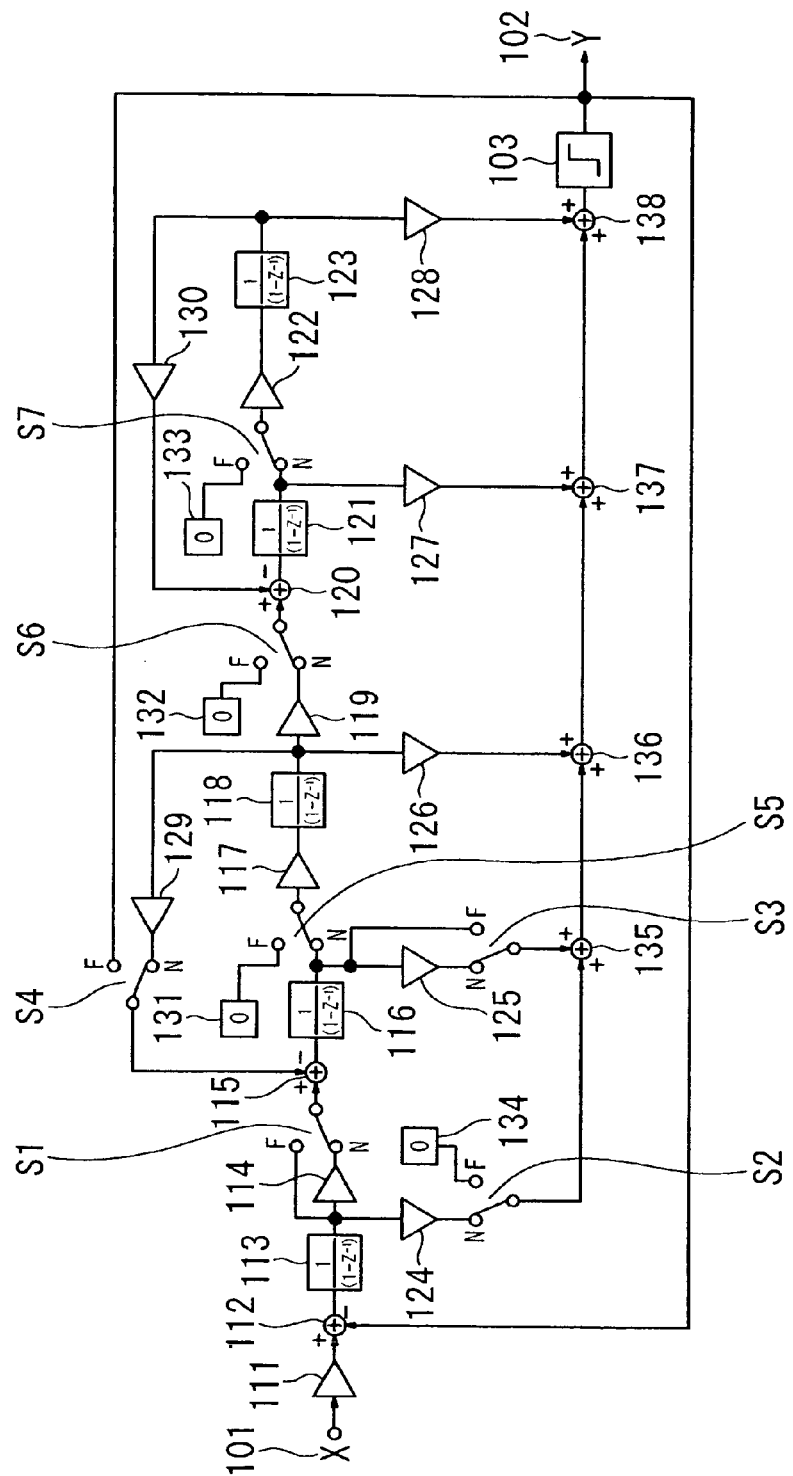
FIG. 2 is a block diagram of a variable-order delta sigma modulator relating to the second embodiment of the invention.

FIG. 2 illustrates a block diagram of the fifth order delta sigma modulator relating to the second embodiment.

In the drawing, the numeric symbol 101 signifies an input terminal, 102 an output terminal, 103 a quantizer, S1 through S7 selectors, 111, 114, 117, 119, 122, 124 through 130 multipliers, 112, 115, 120 subtracters, 135 through 138 adders, 113, 116, 118, 121, 123 integrators, 131 through 134 zero terminals to supply the zero signal (hereunder, mentioned as zero output terminals); and this modulator is configured as follows.

The input terminal 101 connects with the multiplier 111, and the output signal thereof is supplied to the addition input terminal of the subtracter 112. The signal from the subtracter 112 is supplied to the first integrator 113. The signal from the integrator 113 is supplied to the multiplier 114 and the multiplier 124. The selector S1 selects the signal from the first integrator 113 or the signal from the multiplier 114, and the selected signal enters the addition input terminal of the subtracter 115. The subtracter 115 connects with the second integrator 116. The selector S5 selects the signal from the second integrator 116 or the signal from the first zero output terminal 131. The selected signal by the selector S5 passes through the multiplier 117, which is supplied to the third integrator 118. The signal from the third integrator 118 is supplied to the multiplier 119. The selector S6 selects the signal from the multiplier 119 or the signal from the zero output terminal 132, and the selected signal is supplied to the addition input terminal of the subtracter 120. The signal from the subtracter 120 is supplied to the fourth integrator 121, and the selector S7 selects the signal from the fourth integrator 121 or the signal from the zero output terminal 133. The selected signal by the selector S7 passes through the multiplier 122, which enters the fifth integrator 123. The signal from the integrator 123 passes through the multiplier 128, which enters the first input terminal of the adder 138. The signal from the adder 138 passes through the quantizer 103, which is supplied to the output terminal 102.

The signal Y from the quantizer 103 is supplied to the subtraction input terminal of the subtracter 112. And, the selector S4 selects the signal Y from the quantizer 103 or the signal passing through the multiplier 129 from the third integrator 118, and the selected signal enters the subtraction input terminal of the subtracter 115.

The signal from the fifth integrator 123 passes through the multiplier 130, which is fed back to the subtraction input terminal of the subtracter 120.

Further, the selector S2 selects the signal passing through the multiplier 124 from the first integrator 113 or the signal from the zero output terminal 134, and the selected signal enters the second addition input terminal of the adder 135. And, the selector S3 selects the signal passing through the multiplier 125 from the second integrator 116 or the signal from the second integrator 116, and the selected signal enters the first addition input terminal of the adder 135.

Further, the signal from the third integrator 118 passes through the multiplier 126, and enters the first addition input terminal of the adder 136, while the signal from the adder 135 enters the second addition input terminal of the adder 136. And, the signal from the adder 136 enters the second addition input terminal of the adder 137, while the signal passing through the multiplier 127 from the integrator 121 enters the first addition input terminal of the adder 137. Finally, the output signal from the adder 137 enters the second addition input terminal of the adder 138.

Next, the mechanism of switching the order of the delta sigma modulator by using the selectors will be described. Here, the N-terminal and the F-terminal of each selector are defined as follows:

as to the selector S1, the N-terminal is the output terminal of the multiplier 114, and the F-terminal is the output terminal of the first integrator 113;

as to the selector S2, the N-terminal is the output terminal of the multiplier 124, and the F-terminal is the output terminal of the zero output terminal 134;

as to the selector S3, the N-terminal is the output terminal of the multiplier 125, and the F-terminal is the output terminal of the second integrator 116;

as to the selector S4, the N-terminal is the output terminal of the multiplier 129, and the F-terminal is the output terminal 102;

as to the selector S5, the N-terminal is the output terminal of the multiplier 116, and the F-terminal is the output terminal of the zero output terminal 131;

as to the selector S6, the N-terminal is the output terminal of the multiplier 119, and the F-terminal is the output terminal of the zero output terminal 132; and as to the selector S7, the N-terminal is the output terminal of the multiplier 121, and the F-terminal is the output terminal of the zero output terminal 133.

Under the above definition, the state where the selectors S1 through S7 are connected to the F-terminal as shown in FIG. 2 will be rewritten in the state as shown in FIG. 3. That is, the rewritten delta sigma modulator is configured such that the input terminal 101, multiplier 111, adder 112, integrator 113, adder 115, integrator 116, quantizer 103, and output terminal 102 are cascaded, and the output Y is fed back to the two adders 112 and 115 as a subtraction input. Since this delta sigma modulator contains the integrators 113 and 116 inside the feedback loop, the order thereof is the second order.

Next, the state where the selectors S1 through S5 are connected to the N-terminal and the selectors S6 and S7 are connected to the F-terminal terminal as shown in FIG. 2 will be rewritten in the state as shown in FIG. 4. That is, the new delta sigma modulator has the multiplier 117 and the integrator 118 cascaded to the integrator 116 of the second order delta sigma modulator in FIG. 3, and the output of the integrator 118 is fed back to the adder 115 through the multiplier 129.

The outputs of the integrator 113 and integrator 116 pass through the multipliers 124 and 125, respectively, which enter the adder 135. The output of the adder 135 enters the adder 136, together with the output of the integrator 118 passing through the multiplier 126. The output of the adder 136 is supplied to the quantizer 103 to output the quantized output Y, and the output Y is fed back to the adder 112 as a subtraction input. Since this delta sigma modulator contains three integrators 113, 116, and 118, the order thereof is the third order.

In the same manner, when the selectors S1 through S6 are connected to the N-terminal and the selector S7 is connected to the F-terminal, this delta sigma modulator contains four integrators to form the fourth order delta sigma modulator. And, when all the selectors S1 through S7 are connected to the N-terminal, since this modulator contains five integrators, it forms the fifth order delta sigma modulator.

To put all these together will make a table as shown in FIG. 5, which illustrates the relations between the orders and the selection terminals.

Thus in this embodiment, to provide the selectors S1 through S7 and vary the connections of the switch circuits will realize a variable-order delta sigma modulator without increasing the circuit scale.

Figure 9:
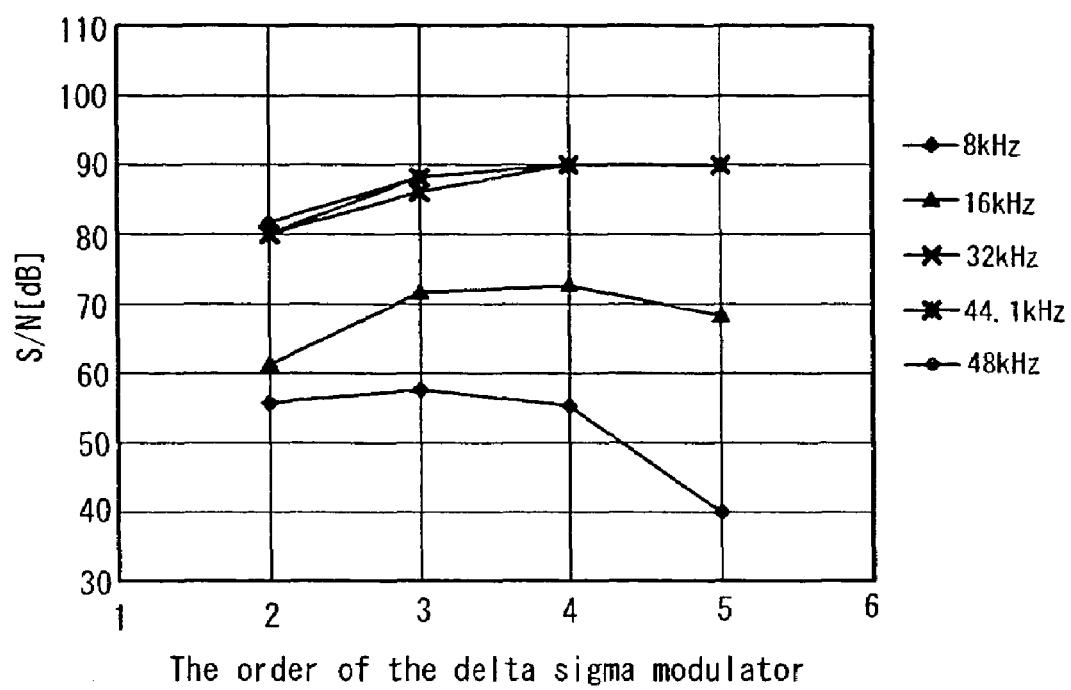
FIG. 9 is a graph illustrating the relation between the order of the delta sigma modulator and the SN ratio, in each of the sampling frequencies.

FIG. 7 illustrates a delta sigma modulator relating to the third embodiment of the invention, which contains a control means of automatically switching the order into an optimum one accompanied with the switching of sampling frequencies. In the drawing, a delta sigma modulator 40 is the variable-order modulator having the selectors. A CPU 41 controls to implement an optimum-order modulator in correspondence with a sampling frequency. A sampling frequency detection unit 42 detects a currently used sampling frequency. A storage unit 43 stores a table M and a table N. The table M shows the combinations between the sampling frequencies and the orders optimum to the sampling frequencies, which are formed on the basis of the graph of the order against the SN ratio illustrated in FIG. 9 (according to FIG. 9, when the sampling frequency is 8 kHz, 16 kHz, 32 kHz, 44.1 kHz, 48 kHz, the optimum order is the second, fourth, fifth, fourth (or fifth), fifth, respectively; and this is formed into the table as shown in FIG. 6). The table N shows the connections of the integrators by the means that vary the combinations of the plural integrators against the orders of the modulator (as an example, the table as shown in FIG. 5 can be cited, which illustrates the relations between the orders and the selection terminals in the delta sigma modulator).

The sampling frequency detection unit 42 detects the sampling frequency having been switched, which is informed to the CPU 41. The CPU looks up this sampling frequency and the table M stored in the storage unit 43 to determine the order optimum to the sampling frequency. Next, the CPU determines the connections of the selectors on the basis of the table N in order to realize the delta sigma modulator of this order. And, the CPU transmits the control signal for determining the connections of the selectors to the delta sigma modulator 40, and the variable-order delta sigma modulator is formed into an optimum-order delta sigma modulator based on this control signal.

Here in this embodiment, the sampling frequency detection means detects the sampling frequency; however, the means is not limited to this example, and it will not be excluded to set the sampling frequencies and use the values of the set sampling frequencies.

FIG. 8 illustrates a DA converter relating to the fourth embodiment of the invention. The digital input signal enters an over-sampling circuit 50. The over-sampling circuit 50 raises the sampling frequency of the digital signal, and supplies the output signal to a noise shaper 51. The noise shaper 51 reduces lower-band noises, and supplies the noise-shaped signal to a waveform shaper 52 and LPF 53. The digital signal is converted into the analog signal by the waveform shaper 52 and LPF 53. To apply the variable-order delta sigma modulator to the noise shaper 51 will implement the DA converter having the maximum SN ratio against the sampling frequency to be used.

What is claimed is:

1. A variable-order delta sigma modulator comprising:
   a plurality of integrators arranged in sequence to have a construction that supplies an output signal from one said plurality of integrators to at least one integrator of a next-stage;
   means of disconnecting or connecting circuits, provided in connection parts to supply the output signal to the next stage integrators;
   a quantization error circuit coupled to the outputs of said plurality of integrators and adapted to generate a quantization error;
   a circuitry to feed back said quantization error to the input of said one plurality of integrators;
   means of controlling the disconnecting or connecting means on the basis of a detected or set sampling frequency, whereby an order of the modulator is made variable in relation to the detected or set sampling; and
   a control means that switches the order of the modulator into an order optimum to a new sampling frequency, accompanied with the switching of the sampling frequency, on the basis of a table showing connections or disconnections of the integrators by the means that vary the order of the delta sigma modulator and the combination of plural integrators, and a table showing relations between the sampling frequencies and the optimum orders.

2. A DA converter comprising a delta sigma modulator as claimed in claim 1.

3. A variable-order delta sigma modulator comprising:
   a plurality of integrators arranged to supply an output signal to respective multipliers;
   a plurality of selectors that select a signal from at least one of the respective multipliers or a zero output terminal; and
   means for setting an order of the delta sigma modulator into an optimum order on the basis of a sampling frequency.

4. A DA converter comprising a delta sigma modulator as claimed in claim 3.

5. The variable-order delta sigma modulator according to claim 3, further comprising:
   a plurality of subtractors that receive the selected signal, and supply subtracted signals to the plurality of integrators.

* * * * *